US009180594B2

(12) United States Patent
Heriban et al.

(10) Patent No.: US 9,180,594 B2
(45) Date of Patent: Nov. 10, 2015

(54) TOOL FOR A MICROTECHNICAL CLIP (75) Inventors: David Heriban, Ecole Valentin (FR); Joël Agnus, Auxon dessous (FR)

(73) Assignees: Centre National De La Recherche Scientifique CNRS, Paris Cedex (FR); Universite De Franche-Comte, Besancon (FR)

( * ) Notice: Subject to any disclaimer, the term of this patent is extended or adjusted under 35 U.S.C. 154(b) by 0 days.

(21) Appl. No.: 14/124,204

(22) PCT Filed: May 24, 2012

(86) PCT No.: PCT/FR2012/000208
§ 371 (c)(1),
(2), (4) Date: Mar. 5, 2014

(87) PCT Pub. No.: WO2012/168568
PCT Pub. Date: Dec. 13, 2012

(65) Prior Publication Data
US 2014/0167432 A1 Jun. 19, 2014

(30) Foreign Application Priority Data

Jun. 6, 2011 (FR) ..................................... 11 01715

(51) Int. Cl.
*B25J 7/00* (2006.01)
*B25J 15/02* (2006.01)
*B81C 99/00* (2010.01)
*B25J 15/00* (2006.01)

(52) U.S. Cl.
CPC ................ *B25J 15/0253* (2013.01); *B25J 7/00* (2013.01); *B25J 15/0028* (2013.01); *B25J 15/02* (2013.01); *B81C 99/002* (2013.01); *Y10T 29/49826* (2015.01)

(58) Field of Classification Search
CPC ............ B25J 7/00; B25J 9/0015; B25J 13/08; B25J 15/04; B25J 15/0408; B25J 15/0475; B25J 15/0253; B25J 15/12; B81C 99/002
USPC ............................................... 294/86.4, 99.1
See application file for complete search history.

(56) References Cited

U.S. PATENT DOCUMENTS

| 4,666,198 A | 5/1987 | Heiserman |
| 5,046,773 A | 9/1991 | Modesitt |
| 5,332,275 A | 7/1994 | Conway et al. |

(Continued)

FOREIGN PATENT DOCUMENTS

| DE | 101 14 551 C1 | 10/2002 |
| WO | WO 2004/028756 A2 | 4/2004 |

OTHER PUBLICATIONS

International Search Report, corresponding to PCT/FR2012/000208, dated Oct. 4, 2012, 4 pages.

*Primary Examiner* — Dean Kramer
(74) *Attorney, Agent, or Firm* — Christie, Parker & Hale, LLP (57) ABSTRACT

The present invention relates to a tool for a microtechnical gripper. The tool of the invention includes a tip having a support and first and second fingers disposed opposite one another in a chosen position. Each finger is connected to the support by a connecting element so as to be held in a rest position corresponding to the chosen position, the connecting element being flexible in order to allow the fingers to move with at least one degree of freedom relative to the support.

14 Claims, 6 Drawing Sheets

(56) References Cited

U.S. PATENT DOCUMENTS

| | | | |
|---|---|---|---|
| 7,322,622 B2 * | 1/2008 | Hashiguchi et al. | 294/86.4 |
| 7,431,364 B2 * | 10/2008 | Huang et al. | 294/99.1 |
| 7,849,515 B2 * | 12/2010 | Hashiguchi et al. | 850/18 |
| 8,317,245 B2 * | 11/2012 | Sun et al. | 294/86.4 |
| 2006/0181097 A1 | 8/2006 | Choi et al. | |
| 2009/0199651 A1 * | 8/2009 | Park et al. | 73/796 |

* cited by examiner

TOOL FOR A MICROTECHNICAL CLIP

CROSS-REFERENCE TO RELATED APPLICATION(S)

This application is a National Phase Patent Application and claims priority to and benefit of International Application Number PCT/FR2012/000208, filed on May 24, 2012, which claims priority to and benefit of French Patent Application Number 11/01715, filed on Jun. 6, 2011, the entire disclosures of which are incorporated herein by reference.

The present invention relates to a tool for a microtechnical gripper, comprising a tip, and to a microtechnical gripper and its mounting process comprising such a tool.

Micro- and nano-technologies are evolving rapidly. These technologies employ manufacturing and processes on a sub-millimetre scale, namely in the micrometre and nanometre range.

The applications of micro- and nano-technologies are vast and are used especially for micromachining in the manufacture of microsystems (electronic chips of the sensor/actuator type) or electromechanical microsystems/nanosystems (MEMS: "microelectromechanical systems", MST: "microsystem technology" or NST: "nanosystem technology").

The above-mentioned systems find their application in various fields, among which there may be mentioned the automobile industry, aeronautics, telecommunications, biotechnology, medicine, physics, information technology, electronics, molecular engineering or the engineering of nanomaterials.

The field of mecatronics, which combines electronics, mechanics and information technology to control complex systems, also uses micro- or nano-technological systems.

Equipment in micro- or nano-technologies conventionally uses materials of the piezoelectric type, silicon or the like. The physical phenomena employed are based substantially on the thermal, capacitive, magnetic, piezoelectric, electrostatic or similar properties of the materials used. It is the very nature of the material and of its physical properties which enables compact systems generating movements of high resolution (1 nm to 1 μm) to be produced.

As indicated, these technologies operate on the micro- or nano-metre scale and must have great precision. This is all the more true when objects are to be manipulated or miniaturised components are to be assembled.

In the field of micro- or nano-assembly, devices capable of operating with micrometre or nanometre precision must be provided. There are known today microactuators of the microgripper type which allow objects or components of very small size to be manipulated. Microgrippers generally comprise two deformable mechanical parts. These deformable mechanical parts are commonly called arms. The ends of the arms are arranged so as to allow them to be moved together and/or moved apart.

Moving the respective ends of two adjacent arms together allows microscopic objects or components to be gripped by mechanical clamping. The arms are generally composed of active materials, that is to say materials that are sensitive to an excitation especially of the electrical, magnetic or thermal type. This excitation causes the deformation of the arms and therefore a displacement of their ends and therefore the closing or opening of the microgripper.

Microgrippers can be manufactured in one piece, that is to say monolithically. They are then conventionally referred to as "monolithic microgrippers".

Microgrippers can also be composed of a plurality of separate elements. They are then conventionally referred to as "assembled microgrippers".

When a gripper is produced monolithically, one arm end is generally formed by the terminal portion of said deformable arm. Consequently, deterioration of that terminal portion (end) goes hand in hand with the deterioration of part of the arms and accordingly of the microgripper.

The monolithic microgrippers of the prior art are generally limited in terms of their stroke distance, which rarely exceeds 100 μm. This technology provides a fairly sensitive manipulation precision scale ranging approximately from 0.1 μm to 1 μm.

Among the assembled microgrippers there may be mentioned those which comprise a tip on each terminal arm portion. It is therefore the tip which forms the end of a deformable arm. Consequently, in this type of microgripper, it is the tips which come into contact with the objects or components to be manipulated. These tips, which are often of microscopic size relative to the manipulated objects, are fragile and subject to mechanical stresses, which can cause them to deteriorate or even be destroyed.

The tips can be formed by independent elements designed to be fixed to each arm, permanently or not. In a microgripper with symmetrical clamping provided with two arms, for example, there will be a symmetrical pair of tips, each tip being provided to be fixed to each arm.

An advantage of assembled microgrippers is that the deterioration of a tip (end) does not necessarily result in the deterioration of the corresponding arm.

However, the positioning of these tips on the arms can prove to be problematic, lengthy and inaccurate. In fact, a tip is generally adhesively bonded to the terminal portion of an arm by hand. This can result in tips which are not disposed in an orientation as originally intended. The relative positioning of two adjacent tips is therefore variable and dependent on the manipulations of the operator. The precision required for micro- or nano-technological systems is therefore not guaranteed (precision of 10 μm in the best case). The assembly time is long (more than 30 minutes per gripper), and the fragility of the tips and/or of the arms of the gripper is often incompatible with manual mounting.

There exist robotic devices for disposing tips on the arms. Positioning is more reliable and more precise but requires manufacturing and assembly processes which are expensive and lengthy to carry out. The fragility of the tips requires them to be changed frequently, and the necessary robotic devices must be available.

The assembled microgrippers of the prior art are generally limited in terms of their precision. This technology provides a manipulation precision scale ranging approximately from 10 μm to 100 μm.

The manipulation precision scales between the various microgripper technologies (monolithic or assembled) are different. In fact, a "void" is found for a manipulation precision scale ranging approximately from 1 μm to 10 μm, which is likewise found for the gripper opening strokes.

Document US 2006/0181097 A1 discloses a monolithic microgripper for clamping an object. The deformation of the arms is carried out by external mechanical stress.

Document U.S. Pat. No. 4,666,198 discloses a monolithic microgripper comprising a pair of arms made of a piezoelectric polymer material.

Document U.S. Pat. No. 5,046,773 discloses an assembled microgripper comprising a pair of arms combined with a pneumatic jack. The tips are fitted to the arms by means of a mechanical screw connection.

Document WO 2004/028756 discloses a microgripper which has piezoelectric arms and is equipped with electrodes.

None of the devices described in the documents of the prior art overcomes the deficiencies mentioned above.

The invention will improve the situation.

To that end, the invention introduces a tool for a microtechnical gripper, comprising a tip having a support and a first finger and a second finger, each finger having a fixing base by means of which it is to be fixed to a microactuator arm in order to position the fingers side by side in respective starting positions, which are defined relative to at least one direction of actuation of the arms of the microtechnical gripper. According to the invention, each arm is connected to said support by a respective flexible connecting element which is arranged to hold the finger in a rest position corresponding to its starting position, the connecting element being chosen with stiffness properties that define a compromise between the need to limit the deflection of the connecting element under the weight of the associated finger, whatever the orientation of the finger in space, and the necessity of allowing the finger in question to move relative to the support in the direction or directions of actuation of said arms of the microtechnical gripper.

According to one embodiment, the connecting element has a large dimension which extends substantially as a continuation of the respective finger, and the stiffness properties are defined relative to a direction generally transverse to said large dimension.

Each finger can comprise a claw disposed at the distal end relative to the support.

The connecting element can be made of photosensitive resin of type SU-8.

The tip can be produced monolithically. The connecting element can especially comprise a spring structure.

The tool of the invention can further comprise at least one sensor disposed on at least one of said fingers. Preferably, the sensor is chosen from the group comprising a force sensor, a temperature sensor, a pressure sensor, a humidity sensor and a contact sensor.

The tool of the invention can further comprise a transmission plate connected electrically to the support of the tip.

The invention relates also to a microtechnical gripper comprising a tool according to the invention and a microactuator comprising first and second displaceable arms, each arm being attached by means of a fixing base to the first finger and the second finger.

In a particular embodiment, the microtechnical gripper of the invention comprises a receiver which houses the displaceable arms, the receiver being substantially U-shaped and having two outside walls each marked with a recess configured to receive said support of the tip.

Each finger of said tip can be provided with a sensor, the electrical terminals of which are disposed on the support. A signal transmission plate can comprise electrical connections which are disposed in contact with said support to electrically connect said electrical terminals to said electrical connections.

Preferably, the microactuator of the gripper is chosen from the group consisting of a thermal microactuator, a piezoelectric microactuator and an electrostatic microactuator.

The invention relates also to a microtechnical kit for the mounting of a microtechnical gripper. The kit of the invention comprises a tool for a microtechnical gripper according to the invention, a microactuator having first and second displaceable arms, a substantially U-shaped receiver having two outside walls, each marked with a recess configured to receive said support of the tip of the tool for a microtechnical gripper.

The kit of the invention can comprise a sensor disposed on at least one of the fingers of the tip, the electrical terminals of which are disposed on said support. In this case, the kit further comprises a signal transmission plate which comprises electrical connections and is arranged to be disposed in contact with said support in order electrically to connect said electrical terminals to said electrical connections.

The invention relates also to a process for mounting a microtechnical gripper, comprising the following steps:
a. preparing a tool for a microtechnical gripper according to the invention,
b. preparing a microactuator comprising first and second displaceable arms, and
c. attaching the first and second fingers of the tip for a microtechnical gripper, by means of a fixing base, to the first and second beams, respectively, of the microactuator to form said microtechnical gripper.

The process can further comprise the following step:
b1, displacing said first and second beams of the microactuator into a chosen prior to their attachment in step c.

The process can further comprise the following step:
b2, manipulating each finger by application of a force so as to modify their rest position prior to their attachment in step c.

The process can further comprise the following step:
d. housing said first and second fingers and said first and second beams in a substantially U-shaped receiver having two outside walls marked with at least one recess configured to receive the support of the tip of the tool for a microtechnical gripper, and
e. positioning said support in each recess.

Other advantages and features of the invention will become apparent from reading the detailed description below and from the accompanying drawings, in which.

The drawings and the description below essentially contain elements of a definitive nature. The drawings show, at least in part, aspects which are difficult to describe other than by means of the drawing. They form an integral part of the description and may therefore not only serve for better understanding of the invention, but also contribute to its definition, where appropriate.

Figures 1, 2:
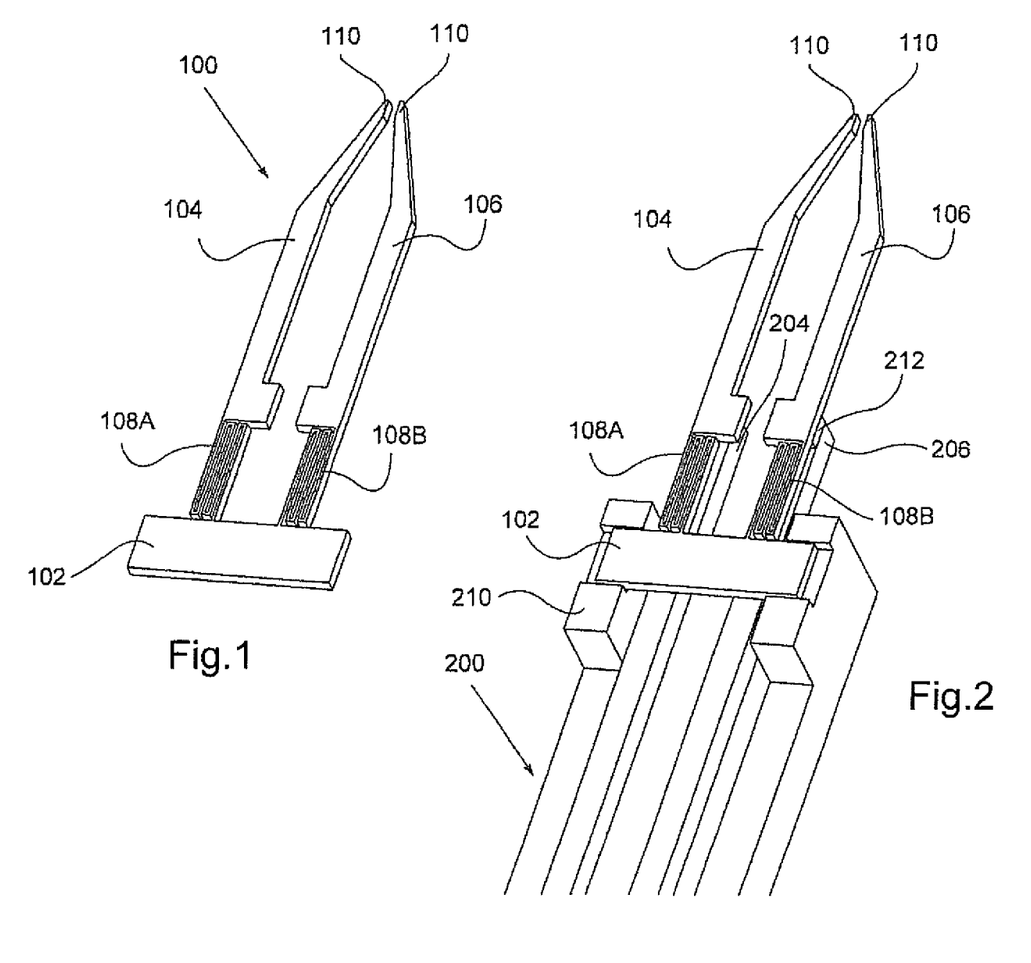
FIG. 1 shows a schematic perspective view of a tip of the tool for a microtechnical gripper according to an embodiment of the invention.
FIG. 2 shows a schematic top view of the tip of FIG. 1 mounted on a microactuator.

FIG. 1 shows a schematic perspective view of a tip according to the invention. The tip 100 comprises a support 102 and first 104 and second 106 fingers disposed opposite one another in a chosen position. Each finger 104 and 106 is connected to the support 102 by a connecting element 108, for example, respective connecting elements 108A and 108B. The connecting element 108 is of low stiffness and allows each finger 104 and 106 to move with at least one degree of freedom relative to the support 102.

In the present description and the accompanying claims, the terms "low stiffness" and "flexibility" (or "flexible") must be regarded as being synonyms. These terms define a property allowing one element to move relative to another, by mechanical deformation.

The tip 100 has the general appearance of a gripper. The gripper shape is the result of the assembly fingers/support, each finger 104 and 106 being connected to the support 102 by a connecting element 108. More precisely, the first finger 104 is connected to the support by a first connecting element 108 and the second finger 106 is connected to the support by a second connecting element 108. In a preferred embodiment, each finger 104 and 106 comprises one or more claws 110.

The tip 100 is designed to hold an object between the claws 110 when they are displaced towards one another (gripping movement).

FIG. 1 shows a pair of claws 110 disposed at the distal end of each finger 104 and 106 relative to the support 102. Each pair finger/claw extends in a substantially opposite direction relative to its opposing equivalent. In other words, the two pairs first finger 104/claw 110 and second finger 106/claw 110 are enantiomorphic. In general, there is a plane of symmetry between the claws 110, and even between each finger 104 and 106.

The claw 110 allows an object to be held and sensitively manipulated. Each pair finger 104 or 106/claw 110 is generally L-shaped.

Considering the support 102 to be fixed, each finger 104 and 106 (with or without a claw 110) is movable with at least one degree of freedom in space. This movability is provided by each connecting element 108 connecting the first 104 and second 106 fingers to the support 102.

The connecting element 108 can be a structure of the spring type in order to provide the required flexibility. The connecting element 108 can be made of silicon.

The connecting element 108 can also be made of resin of the SU-8 resin type. In this embodiment, the connecting element 108 is not necessarily configured as a spring-type structure. The required flexibility is provided by the SU-8 resin material.

The tip 100 is arranged to be attached by one or more fixing points to a microactuator. Each fixing point is formed by a so-called fixing base component (see hereinbelow).

FIG. 2 shows the tip 100 of FIG. 1 mounted on a microactuator. In the embodiment of FIG. 2, the microactuator 200 comprises two deformable piezoelectric beams 204 and 206. One end of each beam is embedded or fixedly affixed at a point of origin disposed in/on a support- or base-type element. The other end of each beam 204 and 206 is attached to the tip 100. More precisely, the first beam 204 is attached to the first finger 104 by means of a fixing base 404. The second beam 206 is attached to the second finger 106 by means of a fixing base 406.

The fixing supports on each finger are disposed close to the connecting element 108. The attachment of the fingers and the beams ensures their joint displacement. When a beam 204 and/or 206 is displaced, the finger 104 and/or 106 connected to that beam is displaced together therewith. The displacement is caused by the deformation of each beam and is effected especially relative to the support 102. Accordingly, there will be seen a free end of each beam which moves relative to the other end embedded or fixedly affixed at said point of origin.

Figure 3:
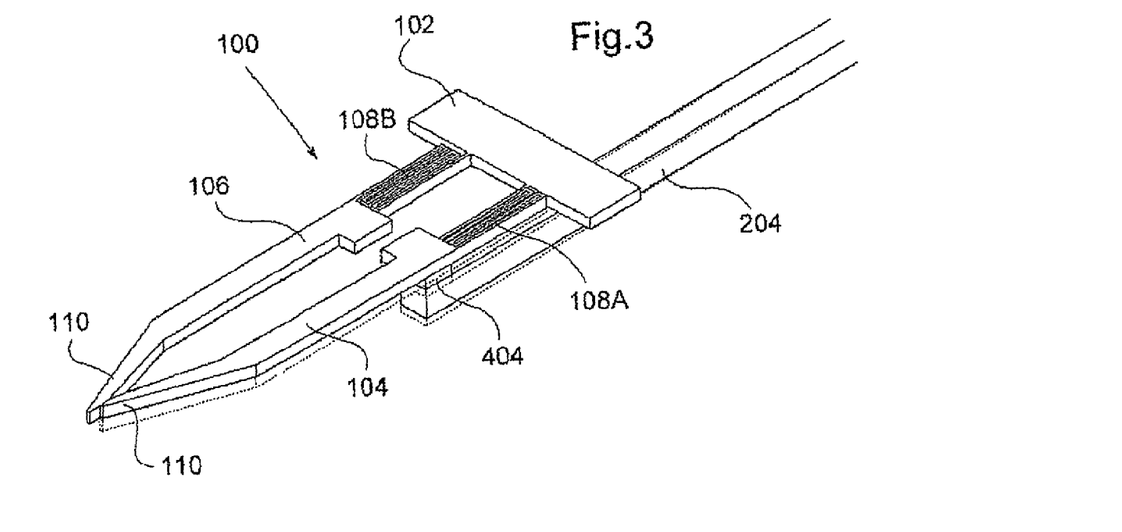
FIG. 3 shows a perspective view of a connecting element in the displacement position of a tip according to an embodiment of the invention.

FIG. 3 shows a movement of a microgripper arm in a vertical direction. The broken (dotted) line shows the rest position of the finger 104 and of the beam 204.

Figure 4:
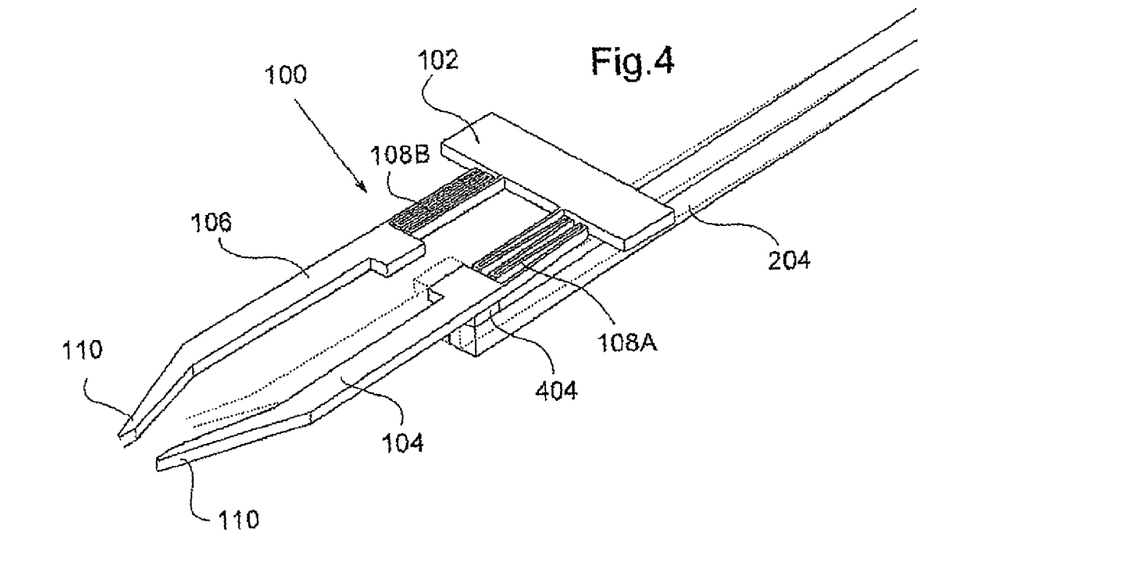
FIG. 4 shows a perspective view of the connecting element of FIG. 3 in a different displacement position.

The beam 204 is actuated and deformed in order to lift the first finger 104. More generally, the movable end of the beam 204 executes a vertical movement and acts on the tip 100 which is integrally attached to that end. The beam 204 exerts a force on the finger 104. Because the connecting element 108 is flexible, it permits a vertical movement of the finger 104 relative to the base 102. The connecting element 108 absorbs the stresses. FIG. 4 shows a movement of a microgripper arm in a horizontal direction. The broken (dotted) line shows the rest position of the finger 104 and of the beam 204.

The beam 204 is actuated and deformed in order to move the first finger 104 horizontally. More generally, the movable end of the beam 204 executes a horizontal movement and acts on the tip 100 which is integrally attached to that end. The beam 204 exerts a force on the finger 104. Because the connecting element 108 is flexible, it permits a horizontal movement of the finger 104 relative to the base 102. The connecting element 108 absorbs the stresses.

The low stiffness of the connecting element 108 allows each finger 104 and 106 to be displaced with at least one degree of freedom. Each finger 104 or 106 is displaced together with the beam to which it is connected by its fixing base 404 or 406. Accordingly, it is necessary to provide a material and a structure such as to ensure the movability of each finger 104 and 106 relative to the support 102. The connecting element 108 can be made of an identical material to the other elements of the tip 100 or it can be made of a separate material.

Preferably, the connecting element 108 is produced so that it is able to define a chosen rest position of each finger/claw. This is generally effected either by using a mechanical form of low stiffness or by using a material having a low Young's modulus, in view of the greater stiffness of the other components of the tip 100. It can be a spring-type structure made of silicon or a rod-type structure made of SU-8 resin.

When the connecting element 108 is in the form of a rod-type structure of SU-8 resin, it is advantageous to provide its embedding in the support 102 and in the associated finger 104 or 106. Because the support and the fingers are made of silicon, it is necessary to provide for contraction of material (shrinkage phenomenon) during manufacturing curing. Consequently, embedding allows the integrity of the support/connecting element connection and/or the finger/connecting element connection to be maintained.

In the embodiment of FIGS. 1 to 8, the fingers 104 and 106 extend substantially parallel to one another in the rest position. Each principal axis of the fingers 104 and 106 is perpendicular to the principal longitudinal axis of the support 102. This gives the tip 100 a generally U-shaped appearance, where the free arms of the U-shape represent the fingers and the base of the U-shape represents the support.

In other embodiments, the rest position of the fingers can be predetermined by partial deformation of the tip 100 and more precisely by alternation of the spacing between the fingers 104 and 106. Accordingly, the tip can especially have a generally V- or Δ-shaped appearance.

Figure 5:
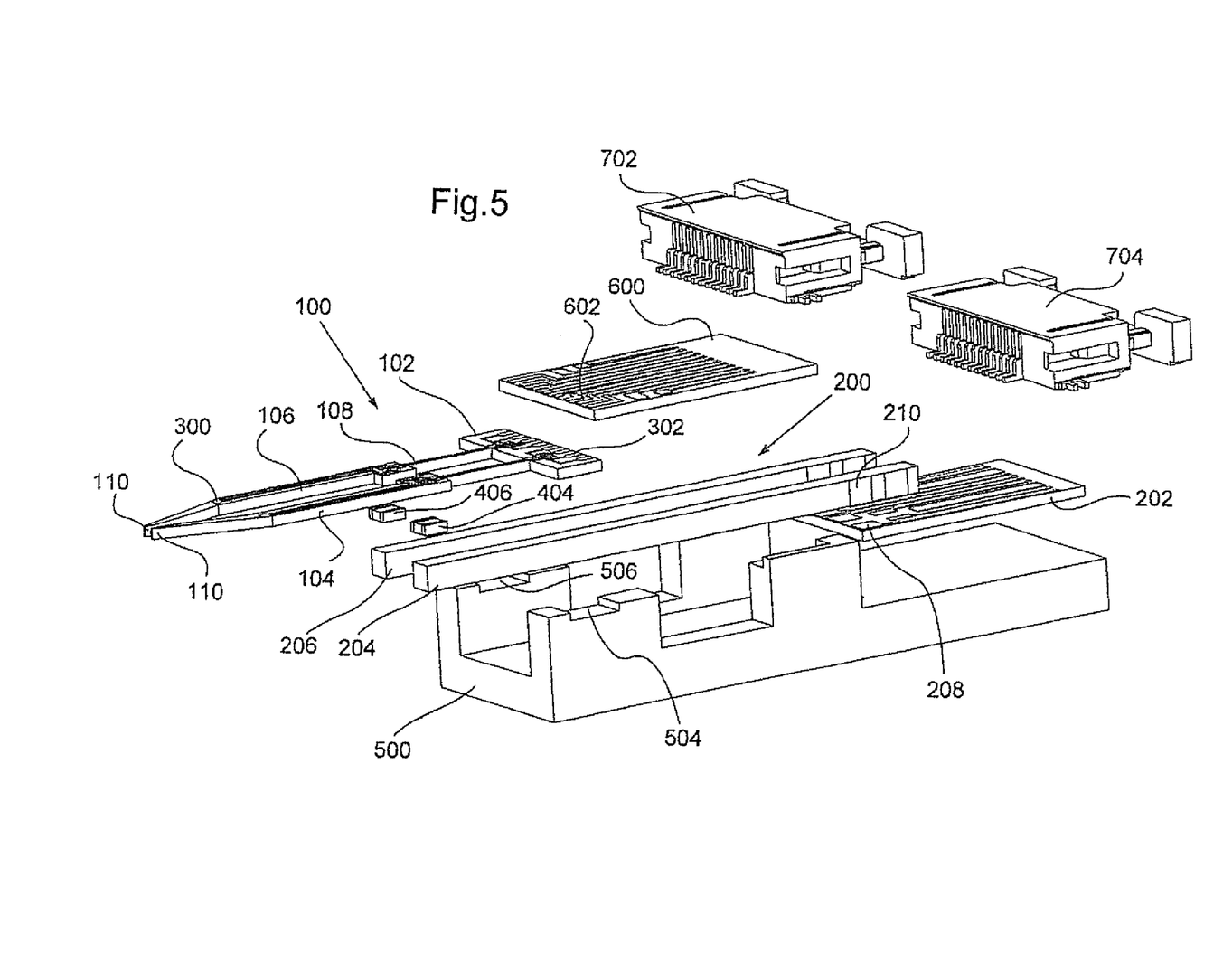
FIG. 5 shows an exploded perspective view of a microtechnical gripper according to an embodiment of the invention.

FIG. 5 shows an exploded perspective view of a microtechnical gripper according to the invention.

The tip 100 is provided to be mounted on the microactuator 200. The microactuator 200 comprises beams 204 and 206 and an electronic support 202. Mounting of the tip 100 on the microactuator 200 is effected by way of fixing bases 404 and 406. More precisely, the first finger 104 is mounted on a fixing base 404, which is itself fixed to the first beam 204; and the second finger 106 is mounted on a fixing base 406, which is itself fixed to the beam 206.

The deformable beams 204 and 206 of the microactuator 200 are adhesively bonded to an electronic support 202. The beams 204 and 206 are connected electrically by welding between the contacts 210 and the electric tracks 208. The microactuator 200 comprises a piezoelectric element which acts on at least one beam deformable in space in order to permit a displacement in translation relative to the electronic support 202. Each deformable beam comprises a free end that is movable in space. In the embodiment of FIG. 5, two beams 204 and 206 are provided.

The fixing bases 404 and 406 are disposed on the microactuator 200 in a position close to the movable end on each beam 204 and 206; more generally, the fixing bases 404 and 406 are disposed in a distal position relative to the electronic support 202.

Each fixing base 404 and 406 is fixed by adhesive bonding to the beams 204 and 206 and to the fingers 104 and 106. Each fixing base 404 or 406 has two bonded surfaces.

In a first embodiment, the contact surfaces between the fixing bases 404 and 406 and the beams 204 and 206 are bonded permanently. The contact surfaces between the fixing bases 404 and 406 and the fingers 104 and 106 are bonded temporarily.

In a second embodiment, the contact surfaces between the fixing bases 404 and 406 and the beams 204 and 206 are bonded temporarily. The contact surfaces between the fixing bases 404 and 406 and the fingers 104 and 106 are bonded permanently.

In both embodiments, the adhesive used for the permanent bonding can be an epoxy-type glue. The adhesive used for the temporary bonding can be of the heat-sensitive thermal glue type (solid at ambient temperature, liquid at a temperature above 60° C.).

In the first embodiment above, it is possible for each beam 204 and 206 to comprise an integrated or appended heating circuit for raising the temperature of each beam in order to activate said thermal glue.

In the second embodiment above, it is possible for each finger 104 and 106 to comprise an integrated or appended heating circuit for raising the temperature of each beam in order to activate said thermal glue.

In both embodiments, the fixing supports can be resistors of the SMC (surface-mounted component) type. By supplying power to said resistors it is possible to use the Joule effect to raise the temperature of the adhesive used for the temporary bonding.

The fixing bases 404 and 406 are provided to effect the attachment of the fingers 104 and 106 and the corresponding beams 204 and 206 of the microactuator 200. On the microactuator 200, the fixing bases 404 and 406 are disposed at the free and movable end of each beam 204 and 206, whereas on the tip 100, the fixing bases 404 and 406 come into contact with the fingers 104 and 106 close to the respective connecting element 108.

The support 102 of the tip 100 is mechanically embedded in the recesses 504 and 506 positioned on the upper portion of the receiver 500. The microactuator 200 is itself mechanically embedded in the receiver 500. The assembly comprising the microactuator 200, the receiver 500 and the support 102 of the tip 100 therefore forms a fixed mechanical group.

Because the connecting elements 108 are deformable in the same way as the beams 204 and 206, the mechanical connection of said beams with the fingers 104 and 106, respectively, by way of the fixing bases 404 and 406 allows the deformation of the beams 204 and 206 to be transmitted to the connecting elements 108 connected to the fingers 104 and 106, respectively. Accordingly, when the first beam 204 is displaced and/or the second beam 206 is displaced, the fingers 104 and/or 106 are displaced correspondingly, while the support 102 remains stationary in a fixed position. The connecting element 108, with its low stiffness, provides for the movability of the fingers 104 and 106 relative to the support.

The connecting element 108 is chosen with well-defined stiffness properties. Those properties depend substantially on the material used, but also on the structure and form of the element 108 (spring-type, rod-type, etc.).

In general, the connecting element 108 is chosen with stiffness properties that define a compromise between the need to limit its deflection under the weight of the associated finger, whatever their orientation in space, and the necessity of allowing the finger in question to move relative to the support 102 in the direction or directions of actuation of said arms of the microtechnical gripper.

In one embodiment, the connecting element 108 must have sufficient stiffness that the weight of a finger generates negligible deformation (100 μm at most), whatever the orientation of the terminal member in space, and the connecting element 108 must have sufficiently low stiffness that it does not impede the displacement of the arms of the microactuator (maximum loss of stroke 50%), whatever the direction of displacement of said actuator.

The design of the flexible connection of the terminal members corresponds to an objective of maintaining the fingers in position prior to assembly, and to a constraint associated with the return force of the flexible connection on displacement of the fingers.

Figure 10:
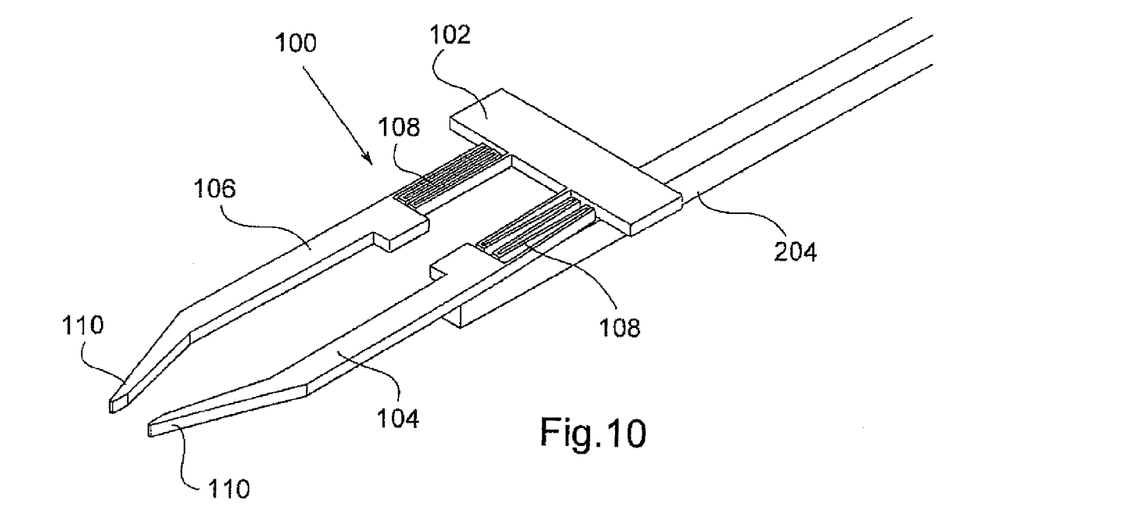
FIG. 10 shows a diagram of a tip fixed to a microgripper arm, a finger of the tip having previously been deformed into a chosen starting position.

Maintenance in position can be provided when the two fingers are positioned relative to one another in a known manner in a chosen starting position (FIG. 10). This knowledge of the relative position of the fingers is provided by the monolithic manufacturing method. That is to say, an orthonormal basis (O, $\vec{x}, \vec{y}, \vec{z}$) allowing 2 vectors to be defined: $\vec{P}_{fab}$ and $\vec{P}_{reel}$.

$\vec{P}_{fab}$ corresponds to the position in space of the two fingers relative to O, known by construction, $\vec{P}_{reel}$ corresponds to the relative actual position of the two fingers relative to O.

There is added thereto a matrix K defined the spatial stiffness of the flexible connection (see below).

Among the various phenomena linking $\vec{P}_{fab}$ and $\vec{P}_{reel}$ (weight, manufacturing faults, material expansion, residual forces, etc.), only the weight can be taken into account. In this case, the weight parameter is involved only in a significant manner in the problem of dimensioning of the flexible connection.

There can thus be defined:

$$\vec{P}_{reel} = \vec{P}_{fab} - m.K \times \vec{g}$$

$$\begin{pmatrix} p^x_{reel} \\ p^y_{reel} \\ p^z_{reel} \end{pmatrix} = \begin{pmatrix} p^x_{fab} \\ p^y_{fab} \\ p^z_{fab} \end{pmatrix} - m. \begin{pmatrix} K_{xx} & K_{xy} & K_{xz} \\ K_{yx} & K_{yy} & K_{yz} \\ K_{zx} & K_{zy} & K_{zz} \end{pmatrix} \times \vec{g}$$

m being the mass of the finger carried by the flexible connection and $\vec{g}$ the gravity vector.

The term $m \cdot K \times \vec{g}$ is considered to represent the essential element of the positioning error between the two fingers.

As shown in FIG. 1, the principal direction of the tips is considered to be $\vec{x}$ (large dimension of the tip), the axis of displacement of the fingers on opening/closing is $\vec{y}$ and the axis of vertical displacement is $\vec{z}$ (transverse directions relative to the large dimension). In the case of principal use, the gravity vector is co-linear to the axis $\vec{z}$. The weight m·g will therefore be carried on the $\vec{z}$ axis and the positioning error will at a first approximation be defined by K (K being of the diagonal matrix type):

$$p_{fab}{}^x - p_{reel}{}^x = 0$$

$$p_{fab}{}^y - p_{reel}{}^y = 0$$

$$p_{fab}{}^z - p_{reel}{}^z = K_{zz} \cdot m \cdot g$$

If a maximum positioning error is fixed, it is possible to give a minimum stiffness, allowing the weight of the finger to be compensated for sufficiently, whatever the orientation of the terminal member in space. In the case of principal use:

$$\text{Min}(K_{zz}) = \frac{\text{Max}(p_{fab}^z - p_{reel}^z)}{m \cdot g}$$

Given that the microtechnical gripper can be oriented in any direction, it will be considered that this minimum stiffness must be respected in all the directions of space.

$$\text{Min}(K_{xx}) = \text{Min}(K_{yy}) = \text{Min}(K_{zz})$$

For a tip as shown in FIG. 1, the mass can be 10 mg. Considering a permissible positioning error of 10 μm, there is obtained a minimum stiffness on z of 10 N/m.

The definition of a minimum stiffness is important, but that stiffness also has an upper limit. The upper limit is defined in relation with the mechanical capacity of the microactuator performing the displacement of the fingers (arms), after the tip has been fixed to said microactuator.

The microactuators used for the displacement (piezoelectric, capacitive, thermal, magnetic, etc.) are characterised by a law involving the maximum displacement stroke $C_{max}$, a control input $\vec{U}$ and an actuating force $\vec{F}$.

$$\vec{C_{max}} = f(\vec{U}, \vec{F})$$

By simplifying the law of behaviour of the actuator used, it is possible to write:

$$\vec{C_{max}} = A \cdot \vec{U} - B \cdot \vec{F}$$

A and B being matrices of parameters of the linearised model of the microactuator used. The matrices are considered to be diagonals for reasons of simplification.

$$A = \begin{pmatrix} a_x & 0 & 0 \\ 0 & a_y & 0 \\ 0 & 0 & a_z \end{pmatrix};$$

$$B = \begin{pmatrix} b_x & 0 & 0 \\ 0 & b_y & 0 \\ 0 & 0 & b_z \end{pmatrix}$$

In the case of multilayer piezoelectric beams (especially as described in FR2845026), the maximum displacement for 11 volts is 50 μm on the $\vec{y}$ axis for a zero force. At zero displacement, for the same voltage, the force is 40 mN. It is then possible to identify the parameters on the same axis:

$$a_y = \frac{C_{max}^y}{U_y} = 4{,}55.10^{-6}$$

$$b_y = a_y \frac{U_y}{F_y} = 1{,}25.10^{-3}$$

Since the microactuator is going to deform the flexible element 108 in order to displace a finger, the law involves the return force of the flexible element 108. This law is dependent on the stiffness properties of the flexible element 108. Thus:

$$\vec{C_{max}^{chargée}} = A \cdot \vec{U} - B \cdot (\vec{F} - K \times \vec{C_{max}^{chargée}})$$

[chargée=under tension]

It is thus possible to define, as a function of the parameters a and b of the microactuator used, a maximum stiffness for which the loss of displacement induced by the flexible element is fixed.

In the case of a multilayer piezoelectric beam, if it is desired to retain a stroke equal to 95% of the free stroke on the $\vec{y}$ axis:

$$C_y^{chargée} = 0{,}95 \times C_{max}^y$$

$$C_y^{chargée} = a_y U_y - b_y(-\text{Max}(K_{yy}) \cdot C_y^{chargée})$$

$$\text{Max}(K_{yy}) = \frac{C_y^{chargée} - a_y U_y}{b_y C_y^{chargée}}$$

[chargée=under tension]

Accordingly, for the case of the piezoelectric beam presented above, there is obtained $$\text{Max}(K_{yy}) = 42 \text{N/m}$$

This calculation of lower and upper limits allows the dimensioning of the stiffness of the flexible element to be optimised in order to ensure the positioning of the fingers, while limiting the loss of actuation induced by the flexible connection 108.

In the embodiment described in FIG. 5, the microactuator 200 is of the piezoelectric type. In a variant, microactuators of the type sensitive to electrostatic, thermal or capacitive effects can be envisaged.

In one embodiment, each beam 204 and 206 is deformable in space with at least one degree of freedom.

In a preferred embodiment, each beam 204 and 206 is of the multilayer piezoelectric type comprising two sets of electrodes. The first set of electrodes causes the deformation of the corresponding beam in a first direction (for example a vertical direction), while the second set of electrodes causes the deformation of the beam in a second direction (for example a horizontal direction).

Accordingly, in the embodiment described here, the displacement of each beam 204 and 206 is carried out with two degrees of freedom starting from a rest position. In principle, these are two degrees of freedom in translation in two substantially perpendicular directions. However, a more complex displacement with two degrees of freedom or more remains envisageable, for example an extension/retraction/twisting movement. FIG. 3 shows the beam 204 in a state contracted and deformed vertically. Consequently, the connecting element 108 is contracted and deformed vertically. FIG. 4 shows the beam 204 in a state contracted and deformed horizontally. Consequently, the connecting element 108 is contracted and deformed horizontally. According to one embodiment of the invention, the microactuator 200 offers a total stroke of the beams 204 and 206 of approximately 200 µm on a first axis and a total stroke of approximately 200 µm on a second axis. In other words, the relative up/down stroke (+/−direction) is approximately 100 µm on a first axis starting from the rest position; and the relative left/right stroke (+/−direction) is approximately 100 µm on a second axis starting from the rest position.

The microactuator 200 is in electrical connection with the electronic support 202, which is connected to a support base 704. The beams 204 and 206 of the microactuator 200 can be housed in a receiver 500. The receiver 500 is substantially U-shaped and has two outside walls marked with a recess 504 and 506, respectively. More precisely, the receiver is in the form of a rectangular tube split in the length direction, the width of which can vary. Each recess 504 and 506 is disposed on the free edges of the receiver 500. Each recess 504 and 506 is configured to receive part of the support 102 of the terminal member 100. FIG. 5 shows a sensor 300 disposed on each claw 110. The sensor can be mounted at another chosen location on each finger. The sensor 300 can be integrated at the time of manufacture of the tip 100, in a monolithic manner. The sensor 300 can also be fitted by assembly to the fingers or claws.

In order to extract the information from the sensor 300, it must be connected electrically to an analysis device. The electrical connection between the sensor 300 and an analysis device is generally difficult to put in place. The embodiment of FIG. 5 shows the electrical terminals 302 disposed on the support 102 of the tip 100. The electrical terminals 302 of the sensor 300 are disposed on the support 102 of the tip 100. The electrical connection between the electrical terminals 302 and an analysis device is provided by way of a transmission plate 600 having electrical connections 602 arranged to be connected to the electrical terminals 302. The connector 702 permits electrical connection with the analysis device.

The sensor 300 can be a force sensor, a strain gauge, a temperature sensor, a pressure sensor, a humidity sensor, a contact sensor or any other type of sensor necessary for carrying out a micromanipulation.

Figure 6:
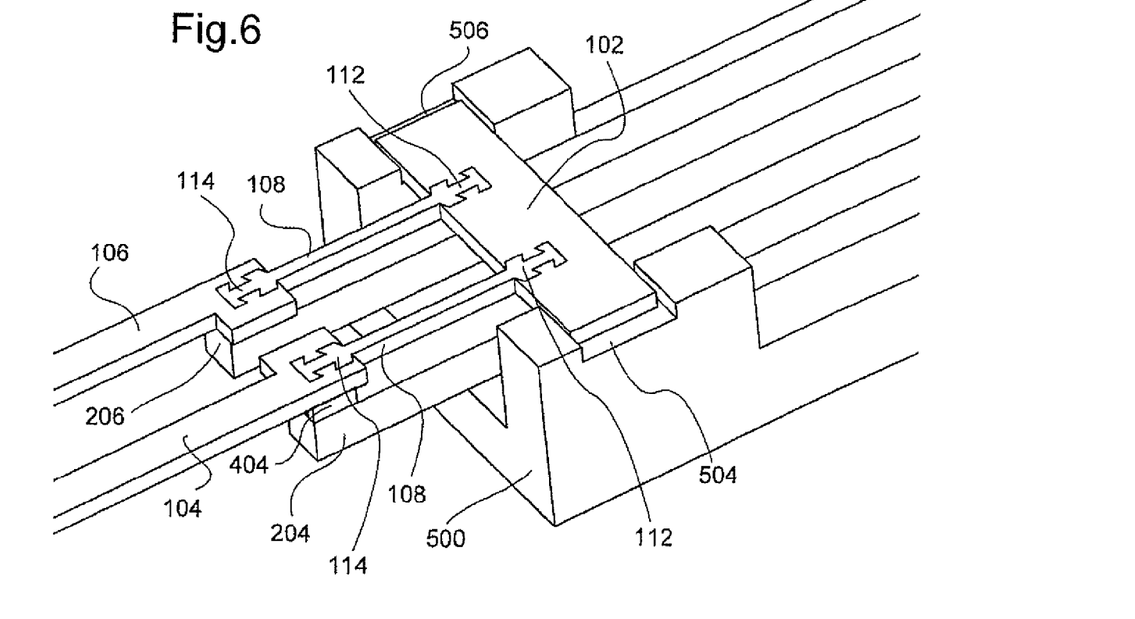
FIG. 6 shows a perspective view of the microtechnical gripper of the invention, partially assembled.

FIG. 6 shows a tip 100 of the invention disposed on a receiver 500. The support 102 is positioned in the recesses 504 and 506 of the receiver 500. The corresponding shape of the recesses 504 and 506, on the one hand, and the support 102, on the other hand, allows said support 102 to be maintained in a stationary position. FIG. 6 shows a detail of FIG. 5, and in particular a connecting element 108 made of SU-8 resin. A first end of the connecting element 108 is embedded in the support 102 by an on-support portion 112. A second end of the connecting element 108 is embedded in a finger 104 or 106 by the on-finger portion 114.

In this configuration, the connecting element 108 can generally comprise a number of electronic tracks greater than the embodiment with a spring-type structure.

Figure 7:
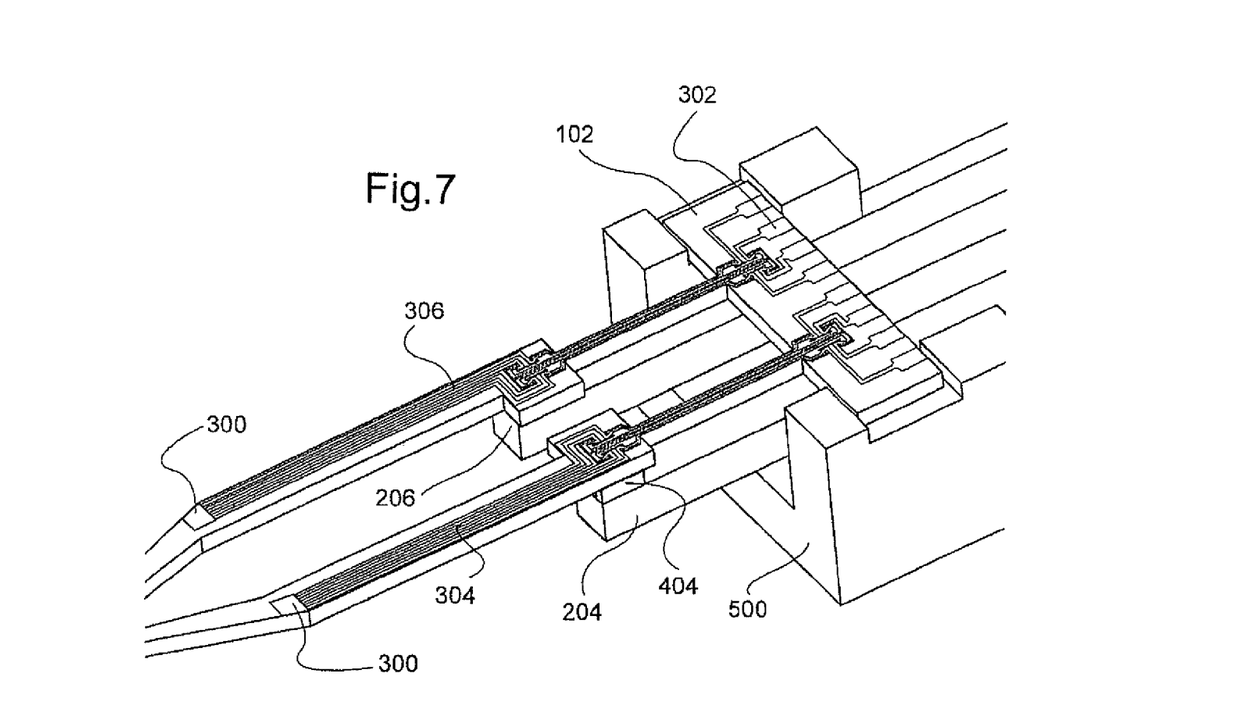
FIG. 7 shows a perspective view of the microtechnical gripper of the invention, partially assembled and comprising a force sensor.

FIG. 7 shows a tip 100 comprising a sensor 300. Electrical tracks 304 provide the electrical connection between the sensor 300 and the electrical terminals 302 on the support 102 of the tip 100.

Figure 8:
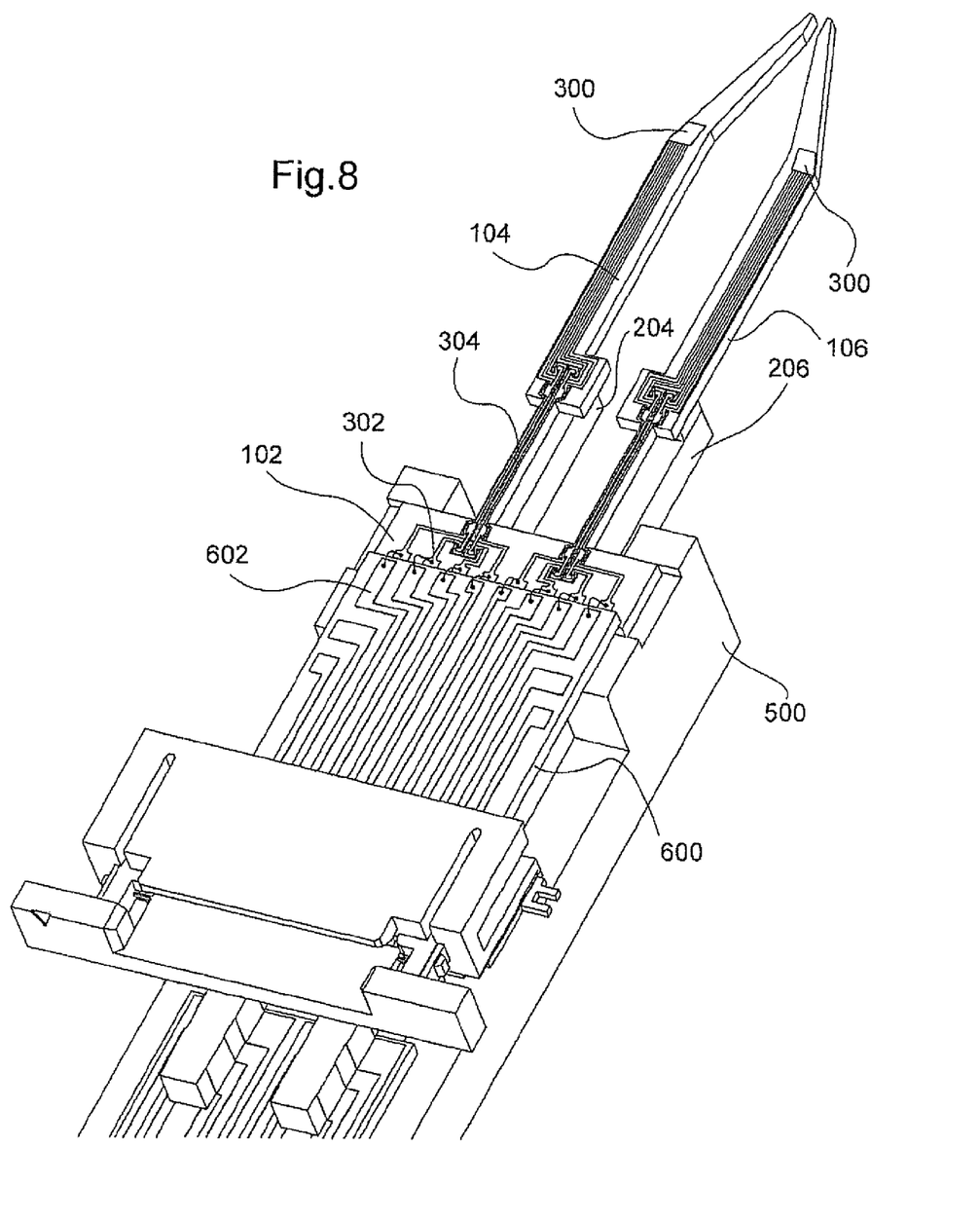
FIG. 8 shows a perspective view of a tip comprising a force sensor assembled to a transmission plate.

FIG. 8 shows a perspective view of a tool for a microtechnical gripper comprising a tip 100 combined with a transmission plate 600. The tip 100 comprises a force sensor 300 connected electrically to electrical terminals 302 disposed on the support 102.

The present invention relates also to a microtechnical kit for the mounting of a microtechnical gripper as described above. The kit can especially comprise a tool for a microtechnical gripper with a tip 100, a microactuator 200 comprising first 204 and second 206 displaceable beams, and a receiver 500 which is substantially U-shaped and has two outside walls marked by one or more recesses 504 and/or 506 configured to receive said support 102 of the tip 100 of the tool for a microtechnical gripper.

In this kit, the tip 100 can be provided with a sensor 300. The kit can likewise comprise mounting utensils, such as, for example, thermal glue for fixing the fingers 104 and 106 to the beams 204 and 206.

It must be understood that the present invention can be in different design forms for its commercialisation. Some components can be pre-assembled in the factory. This depends on the use, the application and any deterioration of the components. By way of example, mention may be made of the combination of a tip 100 and a transmission plate 600 or the combination of the microactuator 200 with an electrical connection plate 700 and a receiver 500.

The tip 100 can constitute a so-called "disposable" or "exchangeable" component. Replacement or exchange of the tip 100 can be provided after deterioration of the claws 110 or if the application changes (for example when it is useful to manipulate using particular claws 110).

Replacement of the tip 100 is simplified for the user if the tip 100 is provided together with the transmission plate 600, as shown in FIG. 8. The two components can be pre-assembled in the factory and thus facilitate, where appropriate, the maintenance of the microtechnical gripper during a replacement or exchange.

The invention relates further to a process for mounting a microtechnical gripper.

Figure 9:
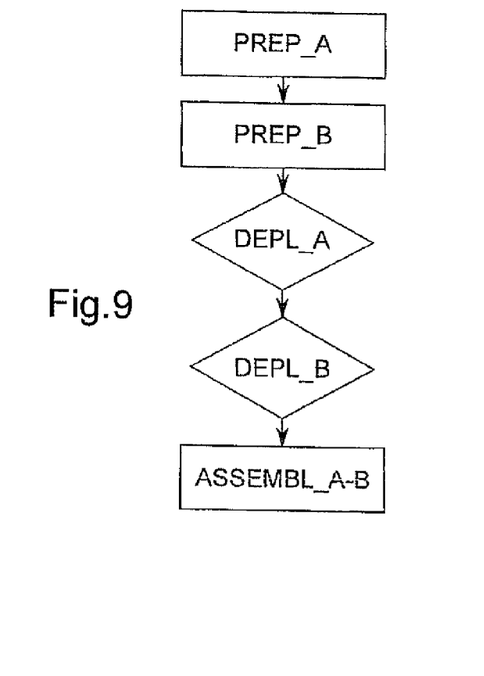
FIG. 9 is a flow chart of a process for mounting a microgripper according to the invention.

FIG. 9 shows the various operations of said mounting process.

A first operation PREP_A comprises the preparation of a tool for a microtechnical gripper with the provision of a tip 100. A second step PREP_B comprises the preparation of a microactuator 200 having first 204 and second 206 displaceable beams.

The following operation DEPL_A is optional and consists in manipulating at least one of the fingers 104 and/or 106 so as to modify their rest position prior to their attachment in a terminal assembly operation. Because the connecting element 108 can be produced with low stiffness (flexible), it is possible, by application of forces of the torsion, flexion, traction type or the like, to displace the fingers relative to one another.

A tip 100 can have substantially parallel fingers 104 and 106, which gives it a generally U-shaped appearance.

The fingers 104 and 106 can especially be moved apart relative to one another. The tip 100 then has a generally V-shaped appearance. FIG. 10 shows this mode of mounting. The connecting element 108 is deformed at rest, and then the tip 100 is fitted to the beams. After deformation, each finger is in a position called the starting position, as shown in FIG. 10.

The fingers 104 and 106 can especially be brought closer to one another. The tip 100 then has a generally Δ-shaped appearance.

Another optional operation DEPL_B consists in displacing the first 204 and second 206 beams of the microactuator 200 into a chosen position prior to the terminal assembly operation.

The optional operations DEPL_A and DEPL_B can be carried out, as desired, one after the other or at the same time, given that they both occur before the tip 100 is fixed to the microactuator 200.

The optional operations DEPL_A and DEPL_B allow either the beams 204 and 206 to be arranged in a predetermined position (DEPL_B), or the rest position of the fingers 104 and 106 to be modified (DEPL_A). Accordingly, each finger can be fixed to the respective beam in a rest position chosen in view of a desired sensitivity of the manipulation precision scale. Once the microtechnical gripper is assembled, it is in fact the spacing of the fingers 104 and 106 in the rest position that defines the stroke distance. The latter can therefore be predefined during one of the optional operations DEPL_A and DEPL_B. Consequently, the invention provides a microtechnical gripper the manipulation capacities of which cover object sizes which can range from 10 μm to 2000 μm. The invention therefore fills the void that exists in the prior art, providing a gripper capable of manipulating objects of from 10 to 2000 μm with a precision of from 1 to 10 μm.

A terminal operation ASSEMBL_A-B comprises the attachment, by a fixing point (by means of adhesive bonding by the fixing base), of the first 104 and second 106 fingers of the tool for a microtechnical gripper to the first 204 and second 206 beams, respectively, of the microactuator 200 of said microtechnical gripper.

In the present description, attachment is understood as meaning an assembly between a beam and a finger that is sufficiently strong to permit the displacement of said finger when the beam is actuated. In no case must it be understood as meaning a stationary or fixed structure of the components of the microtechnical gripper. The gripping function must be ensured.

In the terminal operation ASSEMBL_A-B, said first 104 and second 106 fingers and said first 204 and second 206 beams are housed in a receiver 500. The receiver 500 is preferably substantially U-shaped (rectangular tube split in the length direction—see especially FIG. 5). The receiver 5 has two outside walls marked with at least one recess 504 and/or 506 which is configured to receive the support 102 of the terminal member 100 of the tool for a microtechnical gripper. The terminal operation ASSEMBL_A-B can therefore comprise the positioning of the support 102 in each recess 504 and/or 506. Bonding of the fixing supports is carried out with an adhesive of the heat-sensitive thermal glue type. In this embodiment, glue can first be positioned as desired, either in a distal position on each beam 204 and 206, or in a position close to the connecting element 108 on each finger 104 and 106. In this embodiment, the beams 204 and 206 comprise an integrated or appended heating circuit for raising the temperature of each beam in order to activate said thermal glue.

The invention claimed is:

1. A tool for a microtechnical gripper, the tool comprising a tip having:
   a support; and
   a first finger and a second finger, each finger having a fixing base by which it is to be fixed to a microactuator arm in order to position the fingers side by side in respective starting positions, which are defined relative to at least one direction of actuation of the microactuator arm,
   wherein each finger is connected to said support by a respective flexible connecting element which is arranged so as to maintain the finger in a rest position corresponding to its starting position, the connecting element being chosen with stiffness properties that define a compromise between the need to limit the deflection of the connecting element under the weight of the associated finger, whatever the orientation of the finger in space, and the necessity of allowing the finger in question to move relative to the support in the direction or directions of actuation of said arms of the microtechnical gripper; and
   a transmission plate connected electrically to the support of the tip.

2. The tool for a microtechnical gripper according to claim 1, wherein the connecting element has a large dimension which extends substantially as a continuation of the respective finger, and the stiffness properties are defined relative to a direction generally transverse to said large dimension.

3. The tool for a microtechnical gripper according to claim 1, wherein each finger comprises a claw disposed at the distal end relative to the support.

4. The tool for a microtechnical gripper according to claim 1, wherein the connecting element is made of photosensitive resin of type SU-8.

5. The tool for a microtechnical gripper according to claim 1, wherein the tip is produced monolithically and wherein the connecting element comprises a spring structure.

6. The tool for a microtechnical gripper according to claim 1, further comprising at least one sensor disposed on at least one of said fingers, the sensor being selected from the group consisting of a force sensor, a temperature sensor, a pressure sensor, a humidity sensor and a contact sensor.

7. A tool for a microtechnical gripper, the tool comprising a tip having:
   a support; and
   a first finger and a second finger, each finger having a fixing base by which it is to be fixed to a microactuator arm in order to position the fingers side by side in respective starting positions, which are defined relative to at least one direction of actuation of the microactuator arm,
   wherein each finger is connected to said support by a respective flexible connecting element which is arranged so as to maintain the finger in a rest position corresponding to its starting position, the connecting element being chosen with stiffness properties that define a compromise between the need to limit the deflection of the connecting element under the weight of the associated finger, whatever the orientation of the finger in space, and the necessity of allowing the finger in question to move relative to the support in the direction or directions of actuation of said arms of the microtechnical gripper, and
   a microactuator having first and second displaceable arms, each arm being attached by a fixing base to the first finger and the second finger, respectively, and wherein a receiver houses the displaceable arms, the receiver being substantially U-shaped and having two outside walls each marked with a recess configured to receive said support of the tip.

8. The tool for a microtechnical gripper according to claim 7, wherein each finger of said tip is provided with a sensor, the electrical terminals of which are disposed on the support, and wherein a signal transmission plate having electrical connections is disposed in contact with said support in order electrically to connect said electrical terminals to said electrical connections.

9. The tool for a microtechnical gripper according to claim 7, wherein the microactuator is chosen from the group consisting of a thermal microactuator, a piezoelectric microactuator and an electrostatic microactuator.

10. A microtechnical kit for the mounting of a microtechnical gripper, comprising:
   a tool for a microtechnical gripper, the tool comprising a tip having:
   a support; and
   a first finger and a second finger, each finger having a fixing base by which it is to be fixed to a microactuator arm in order to position the fingers side by side in respective starting positions, which are defined relative to at least one direction of actuation of the microactuator arm,
   wherein each finger is connected to said support by a respective flexible connecting element which is arranged so as to maintain the finger in a rest position corresponding to its starting position, the connecting element being chosen with stiffness properties that define a compromise between the need to limit the deflection of the connecting element under the weight of the associated finger, whatever the orientation of the finger in space, and the necessity of allowing the finger in question to move relative to the support in the direction or directions of actuation of said arms of the microtechnical gripper,
      a microactuator having first and second displaceable arms, and
      a receiver being substantially U-shaped and having two outside walls each marked with a recess configured to receive said support of the tip of the tool for a microtechnical gripper.

11. A microtechnical kit according to claim 10, wherein a sensor is disposed on at least one of the fingers of the tip, the electrical terminals of which are disposed on said support, said kit further comprising:
   a signal transmission plate which has electrical connections and is arranged to be disposed in contact with said support in order to electrically connect said electrical terminals to said electrical connections.

12. A process for mounting a microtechnical gripper, the process comprising:
   a. providing a tool for a microtechnical gripper, the tool comprising a tip having:
   a support; and
   a first finger and a second finger, each finger having a fixing base by which it is to be fixed to a microactuator arm in order to position the fingers side by side in respective starting positions, which are defined relative to at least one direction of actuation of the microactuator arm,
   wherein each finger is connected to said support by a respective flexible connecting element which is arranged so as to maintain the finger in a rest position corresponding to its starting position, the connecting element being chosen with stiffness properties that define a compromise between the need to limit the deflection of the connecting element under the weight of the associated finger, whatever the orientation of the finger in space, and the necessity of allowing the finger in question to move relative to the support in the direction or directions of actuation of said arms of the microtechnical gripper,
   b. providing a microactuator having first and second displaceable arms,
   c. attaching, by means of a fixing base, the first and second fingers of the tip for a microtechnical gripper to first and second beams, respectively, of the microactuator to form said microtechnical gripper,
   d. housing said first and second fingers and said first and second beams in a receiver which is substantially U-shaped and has two outside walls marked by at least one recess configured to receive the support of the tip of the tool for a microtechnical gripper, and
   e. positioning said support in each recess.

13. The process according to claim 12, further comprising:
   c1. displacing said first and second beams of the microactuator into a chosen position prior to the attachment in step c.

14. The process according to claim 12, further comprising:
   c2. manipulating each finger by application of a force so as to modify their rest positions prior to the attachment in step c.

* * * * *